United States Patent
Smith

(10) Patent No.: US 11,579,265 B2
(45) Date of Patent: Feb. 14, 2023

(54) LIDAR SYSTEM WITH CROSSTALK REDUCTION COMPRISING A POWER SUPPLY CIRCUIT LAYER STACKED BETWEEN AN AVALANCHE-TYPE DIODE LAYER AND A READ-OUT CIRCUIT LAYER

(71) Applicant: Continental Automotive Systems, Inc., Auburn Hills, MI (US)

(72) Inventor: Elliot John Smith, Ventura, CA (US)

(73) Assignee: Continental Autonomous Mobility US, LLC, Auburn Hills, MI (US)

(*) Notice: Subject to any disclaimer, the term of this patent is extended or adjusted under 35 U.S.C. 154(b) by 365 days.

(21) Appl. No.: 16/997,585

(22) Filed: Aug. 19, 2020

(65) Prior Publication Data

US 2022/0057491 A1  Feb. 24, 2022

(51) Int. Cl.
*H01L 31/107* (2006.01)
*G01S 7/4863* (2020.01)
*G01S 17/931* (2020.01)

(52) U.S. Cl.
CPC .......... *G01S 7/4863* (2013.01); *H01L 31/107* (2013.01); *G01S 17/931* (2020.01)

(58) Field of Classification Search
CPC ... H01L 31/107; H01L 31/101; H01L 27/146; H01S 17/88; H01S 17/89; G01S 7/486; H04N 5/374
USPC .............................................. 250/214 R, 239
See application file for complete search history.

(56) References Cited

U.S. PATENT DOCUMENTS

| | | | |
|---|---|---|---|
| 3,804,101 A | 4/1974 | Roth et al. | |
| 4,956,695 A | 9/1990 | Robinson et al. | |
| 8,026,471 B2* | 9/2011 | Itzler ................ | H01L 27/14634 |
| | | | 250/214 R |
| 8,907,439 B1 | 12/2014 | Barker et al. | |
| 8,975,583 B2 | 3/2015 | Blackwell, Jr. et al. | |
| 9,069,080 B2 | 6/2015 | Duerner et al. | |
| 9,110,169 B2 | 8/2015 | Duerner et al. | |
| 9,277,204 B2 | 3/2016 | Gilliland et al. | |
| 9,420,246 B2 | 8/2016 | Huang et al. | |
| 9,797,995 B2 | 10/2017 | Gilliland et al. | |
| 9,834,209 B2 | 12/2017 | Duerner et al. | |
| 9,915,726 B2 | 3/2018 | Bailey et al. | |
| 9,989,406 B2 | 6/2018 | Pacala | |
| 9,992,477 B2 | 6/2018 | Pacala | |
| 10,241,196 B2 | 3/2019 | Bailey | |
| 10,557,926 B2 | 2/2020 | Gilliland | |
| 2012/0170029 A1 | 7/2012 | Azzazy | |
| 2018/0056993 A1 | 3/2018 | Stettner | |
| 2018/0059222 A1 | 3/2018 | Pacala | |

* cited by examiner

Primary Examiner — Que Tan Le

(57) ABSTRACT

A focal-plane array includes an array of pixels. Each pixel includes an avalanche-type diode on a first layer, a read-out circuit (ROIC) on a second layer, and a power-supply circuit on a middle layer stacked between the first layer and the second layer. Since each pixel includes the avalanche-type diode, the ROIC, and the power-supply circuit on different layers circuitry for each pixel is in a top-down footprint of the pixel. Thus a consistent bias voltage to each pixel, decouples the avalanche-type diodes of the different pixels to eliminate crosstalk between adjacent pixels, and allows for individual control of each pixel.

16 Claims, 10 Drawing Sheets

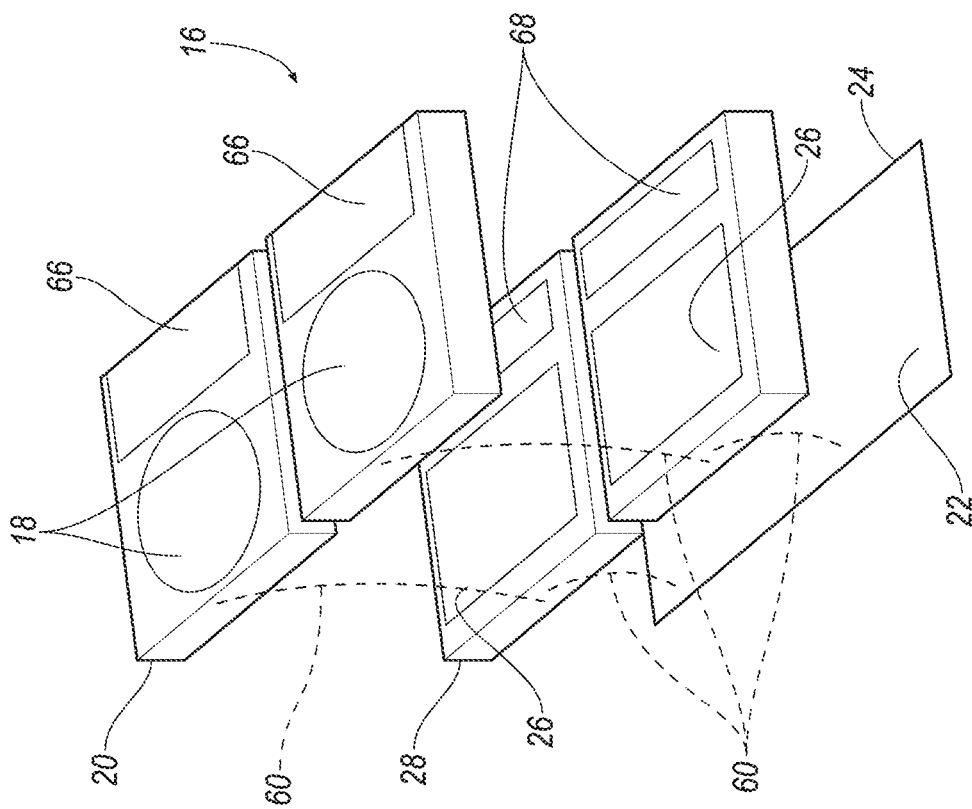
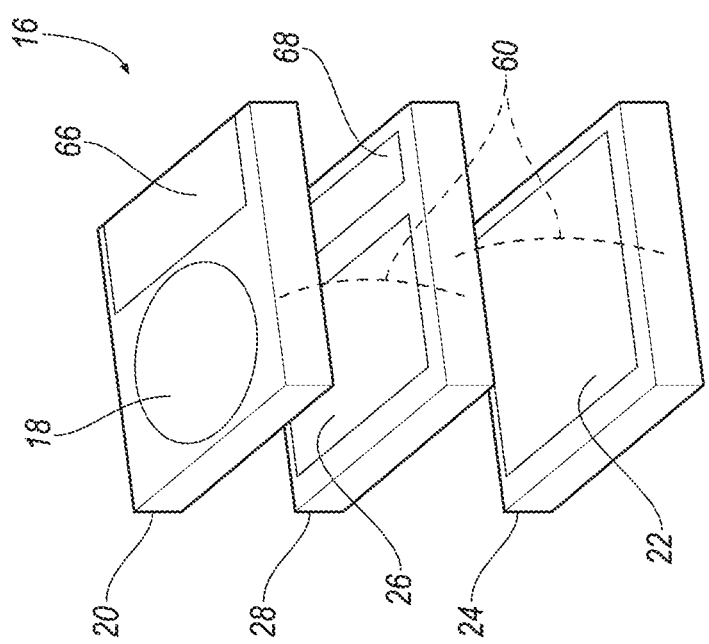
FIG. 7B
FIG. 7A

LIDAR SYSTEM WITH CROSSTALK REDUCTION COMPRISING A POWER SUPPLY CIRCUIT LAYER STACKED BETWEEN AN AVALANCHE-TYPE DIODE LAYER AND A READ-OUT CIRCUIT LAYER

BACKGROUND

A solid-state Lidar (Light Detection And Ranging) system includes a photodetector, or an array of photodetectors, that is fixed in place relative to a carrier, e.g., a vehicle. Light is emitted into the field of view of the photodetector and the photodetector detects light that is reflected by an object in the field of view. For example, a Flash Lidar system emits pulses of light, e.g., laser light, into the entire field of view. The detection of reflected light is used to generate a three-dimensional (3D) environmental map of the surrounding environment. The time of flight of the reflected photon detected by the photodetector is used to determine the distance of the object that reflected the light.

The solid-state Lidar system may be mounted on a vehicle to detect objects in the environment surrounding the vehicle and to detect distances of those objects for environmental mapping. The output of the solid-state Lidar system may be used, for example, to autonomously or semi-autonomously control operation of the vehicle, e.g., propulsion, braking, steering, etc. Specifically, the system may be a component of or in communication with an advanced driver-assistance system (ADAS) of the vehicle.

The solid-state Lidar system includes a focal-plane array having an array of photodetectors. Difficulties can arise in controlling photodetectors of an FPA with biasing methods such as a common cathode. A bias voltage applied to the photodetectors of an FPA by the cathode may drop in a central area of the FPA compared to locations around a perimeter of the FPA. Additionally photodetectors having common bias voltage supply, e.g., common cathode bias, may result in an electrical cross-talk between the photodetectors upon receiving a high energy signal.

BRIEF DESCRIPTION OF THE DRAWINGS

FIG. 7A is a schematic view of an example pixel of the FPA.

FIG. 7B is a schematic view of another embodiment of the pixel of the FPA.

DETAILED DESCRIPTION

Figure 1:
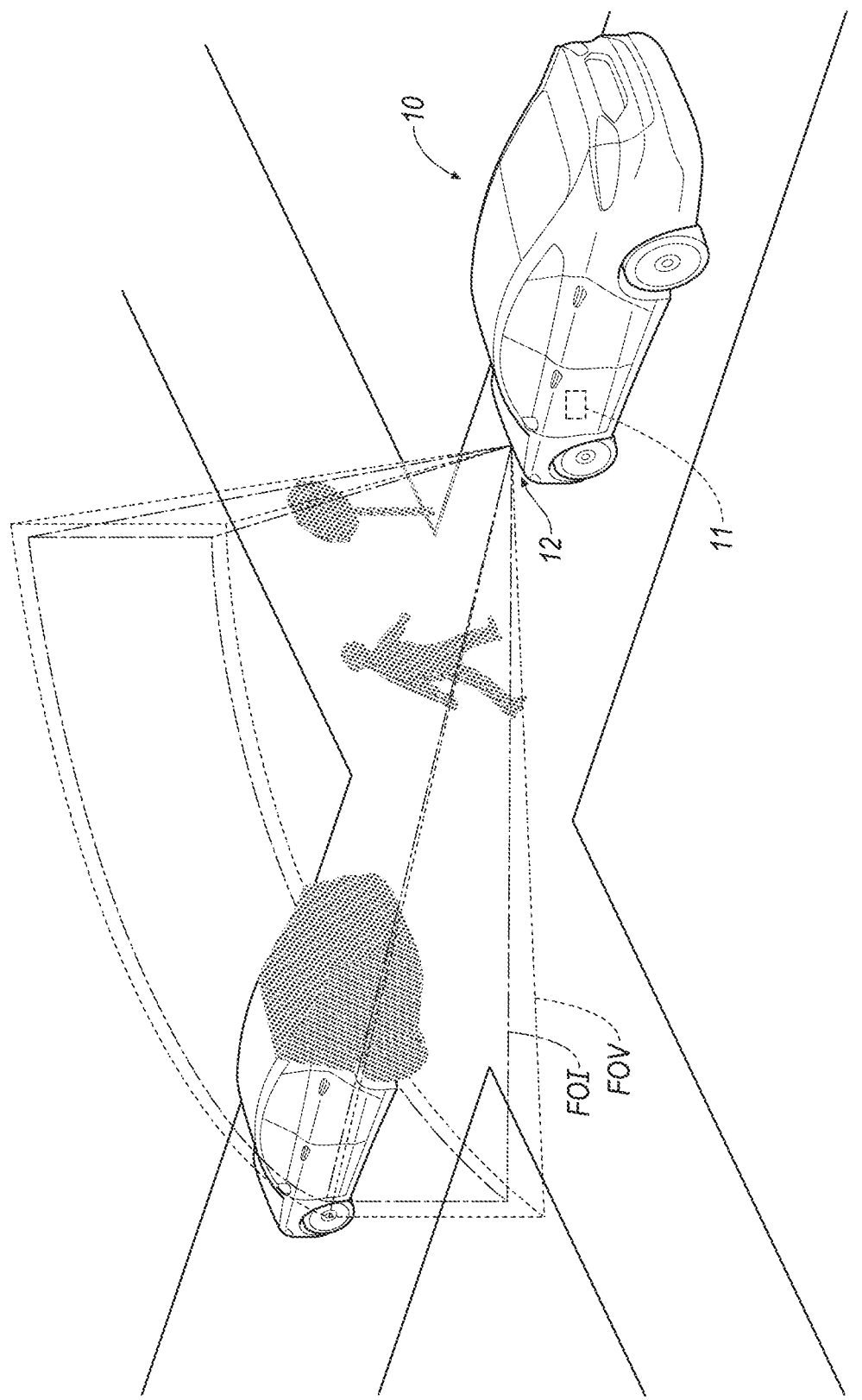
FIG. 1 is a perspective view of a vehicle including a Lidar system.

With reference to the Figures, wherein like numerals indicate like parts throughout the several views, a Lidar system 12 including a focal-plane array assembly (FPA 14) is shown. The FPA 14 can include an array of pixels 16. Each pixel 16 can include a avalanche-type diode 18 (for example an avalanche photodiode (ADP) or a single-photon avalanche diode (SPAD) on a first layer 20, a read-out circuit (ROIC 22) on a second layer 24, and a power-supply circuit 26 on a middle layer 28 stacked between the first layer 20 and the second layer 24.

Since each pixel 16 includes the avalanche-type diode 18, the ROIC 22, and the power-supply circuit 26 on different layers (specifically, the first layer 20, second layer 24, and middle layer 28, respectively), circuitry for each pixel 16 is in a top-down footprint of the pixel 16. As a result, the bias voltage may be consistently applied to each pixels 16, i.e., the bias voltage is consistent from pixel 16 to pixel 16. Specifically, the bias voltage is applied to each pixel 16 on a pixel-by-pixel basis as opposed to a common cathode supplying bias voltage to all pixels. This may allow for not only lookup tables for variations in production, but also for an individual tuning of the bias voltage (e.g., if one or more pixels receive light from a target brighter than rest of FOV, the bias voltage could be lowered for the one or more pixels to handle the dynamic range. Having the avalanche-type diode 18, the ROIC 22, and the power-supply circuit 26 on different layers and the resulting top-down footprint of each pixel 16 also decouples the avalanche-type diodes 18 of the different pixels 16 to eliminate crosstalk between adjacent pixels 16, e.g., in the event of detection of a high-energy signal. Also, having the avalanche-type diode 18, the ROIC 22, and the power-supply circuit 26 on different layers and the resulting top-down footprint of each pixel 16 each pixel to be individually controllable. In another example, a larger node technology, e.g., 130-40 nm, for the first layer 20, an iCMOS for the middle layer 28, and a small node technology, e.g., 28-14 nm, for the second layer 24.

The Lidar system 12 is shown in FIG. 1 as being mounted on a vehicle 10. In such an example, the Lidar system 12 is operated to detect objects in the environment surrounding the vehicle 10 and to detect distances of those objects for environmental mapping. The output of the Lidar system 12 may be used, for example, to autonomously or semi-autonomously control the operation of the vehicle 10, e.g., propulsion, braking, steering, etc. Specifically, the Lidar system 12 may be a component of or in communication with an advanced driver-assistance system (ADAS) of the vehicle 10. The Lidar system 12 may be mounted on vehicle 10 in any suitable position and aimed in any suitable direction. As one example, the Lidar system 12 is shown on the front of the vehicle 10 and directed forward. The vehicle 10 may have more than one Lidar system 12 and/or the vehicle 10 may include other object detection systems, including other Lidar systems. The vehicle 10 is shown in FIG. 1 as including a single Lidar system 12 aimed in a forward direction merely as an example. The vehicle 10 shown in the Figures is a passenger automobile. As other examples, the vehicle 10 may be of any suitable manned or un-manned type including a plane, satellite, drone, watercraft, etc. A computer 11 of the vehicle 10 may be programmed to execute operations disclosed herein.

The computer 11 includes a processor and a memory. The memory includes one or more forms of computer-readable media, and stores instructions executable by the computer 11 for performing various operations, including as disclosed herein. Additionally or alternatively, the computer 11 may include a dedicated electronic circuit including an ASIC (Application Specific Integrated Circuit) that is manufactured for a particular operation, e.g., calculating a histogram of data received from the Lidar system 12 and/or generating a 3D environmental map for a Field of View (FOV) of the vehicle 10. In another example, the computer 11 may include an FPGA (Field Programmable Gate Array) which is an integrated circuit manufactured to be configurable by a customer. As an example, a hardware description language such as VHDL (Very High Speed Integrated Circuit Hardware Description Language) is used in electronic design automation to describe digital and mixed-signal systems such as FPGA and ASIC. For example, an ASIC is manufactured based on VHDL programming provided pre-manufacturing, and logical components inside an FPGA may be configured based on VHDL programming, e.g. stored in a memory electrically connected to the FPGA circuit. In some examples, a combination of processor(s), ASIC(s), and/or FPGA circuits may be included inside a chip packaging. A computer 11 may be a set of computers communicating with one another via the communication network of the vehicle 10, e.g., a computer in the Lidar system 12 and a second computer in another location in the vehicle 10.

The computer 11 may operate the vehicle 10 in an autonomous, a semi-autonomous mode, or a non-autonomous (or manual) mode. For purposes of this disclosure, an autonomous mode is defined as one in which each of vehicle propulsion, braking, and steering are controlled by the computer 11; in a semi-autonomous mode the computer 11 controls one or two of vehicle propulsion, braking, and steering; in a non-autonomous mode a human operator controls each of vehicle propulsion, braking, and steering.

The computer 11 may include programming to operate one or more of vehicle brakes, propulsion (e.g., control of acceleration in the vehicle by controlling one or more of an internal combustion engine, electric motor, hybrid engine, etc.), steering, climate control, interior and/or exterior lights, etc., as well as to determine whether and when the computer 11, as opposed to a human operator, is to control such operations. Additionally, the computer 11 may be programmed to determine whether and when a human operator is to control such operations.

The computer 11 may include or be communicatively coupled to, e.g., via a vehicle 10 communication bus, more than one processor, e.g., controllers or the like included in the vehicle for monitoring and/or controlling various vehicle controllers, e.g., a powertrain controller, a brake controller, a steering controller, etc. The computer 11 is generally arranged for communications on a vehicle communication network that can include a bus in the vehicle such as a controller area network (CAN) or the like, and/or other wired and/or wireless mechanisms.

The Lidar system 12 may be a solid-state Lidar system. In such an example, the Lidar system 12 is stationary relative to the vehicle 10. For example, the Lidar system 12 may include a casing 30 (shown in FIG. 2 and described below) that is fixed relative to the vehicle 10, i.e., does not move relative to the component of the vehicle 10 to which the casing 30 is attached, and a silicon substrate of the Lidar system 12 is supported by the casing 30.

As a solid-state Lidar system, the Lidar system 12 may be a flash Lidar system. In such an example, the Lidar system 12 emits pulses of light into the field of illumination FOI. More specifically, the Lidar system 12 may be a 3D flash Lidar system that generates a 3D environmental map of the surrounding environment, as shown in part in FIG. 1. An example of a compilation of the data into a 3D environmental map is shown in the FOV and the field of illumination (FOI) in FIG. 1. A 3D environmental map may include location coordinates of points within the FOV with respect to a coordinate system, e.g., a Cartesian coordinate system with an origin at a predetermined location such as a GPS (Global Positioning System) reference location, or a reference point within the vehicle 10, e.g., a point where a longitudinal axis and a lateral axis of the vehicle intersect.

In such an example, the Lidar system 12 is a unit. A Lidar system 12 may include a casing 30, an outer optical facia 32, a light receiving system 34, and a light emitting system 36. The focal-plane array (FPA) 14 is a component of the light receiving system 34 of the Lidar system 12 as discussed below with respect to FIGS. 3-9.

The casing 30, for example, may be plastic or metal and may protect the other components of the Lidar system 12 from environmental precipitation, dust, etc. In the alternative to the Lidar system 12 being a unit, components of the Lidar system 12, e.g., the light emitting system 36 and the light receiving system 34, may be separate and disposed at different locations of the vehicle 10. The Lidar system 12 may include mechanical attachment features to attach the casing 30 to the vehicle 10 and may include electronic connections to connect to and communicate with electronic system of the vehicle 10, e.g., components of the ADAS.

The outer optical facia 32 (which may be referred to as a "window") allows light to pass through, e.g., the laser beam generated by the light emitting system 36 exits the Lidar system 12 and/or light from environment enters the Lidar system 12. The outer optical facia 32 protects an interior of the Lidar system 12 from environmental conditions such as dust, dirt, water, etc. An outer optical facia 32 is typically formed of a transparent or semi-transparent material, e.g., glass, plastic, at the wavelength being measures, e.g. NIR (near infrared). An outer optical facia 32 may extend from the casing 30 and/or may be attached to the casing 30.

Figure 2:
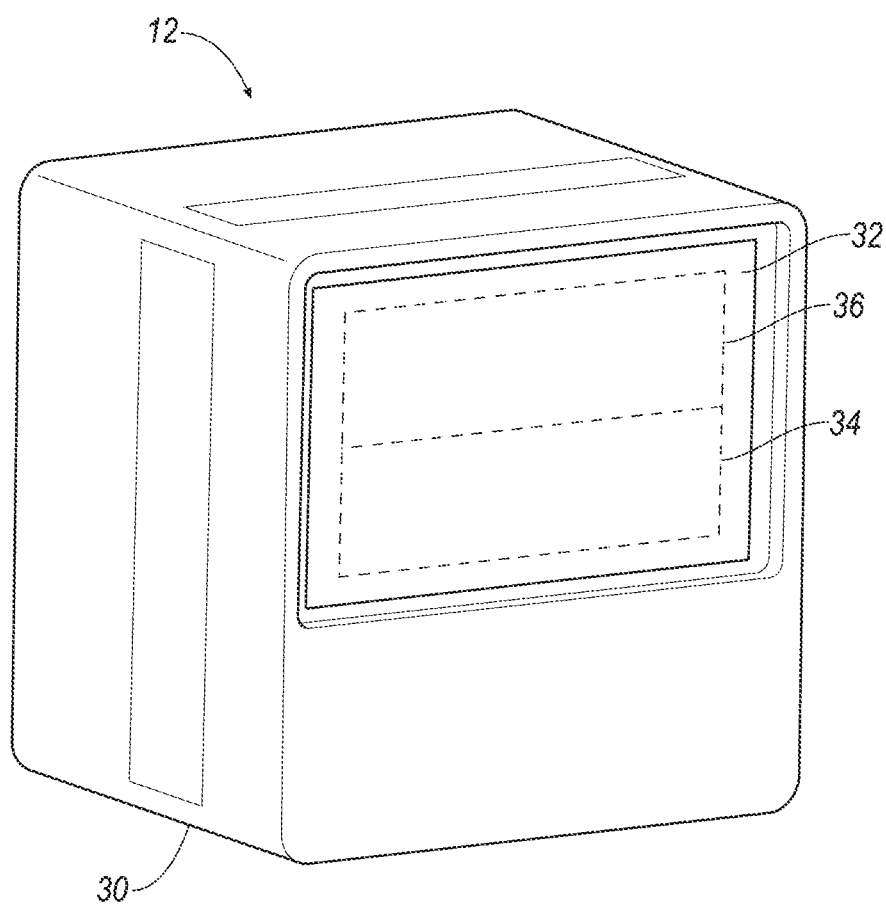
FIG. 2 is a perspective view of the Lidar system having a light emitter and a light receiver.

With continued reference to FIGS. 1-2, the light emitting system 36 emits light into the field of illumination FOI for detection by the light-receiving system 34 when the light is reflected by an object in the field of view FOV. The light emitting system 36 may emit, for example, a laser. The light receiving system 34 has a field of view (hereinafter "FOV") that overlaps the field of illumination FOI and receives light reflected by surfaces of objects, buildings, road, etc., in the FOV.

Figure 3:
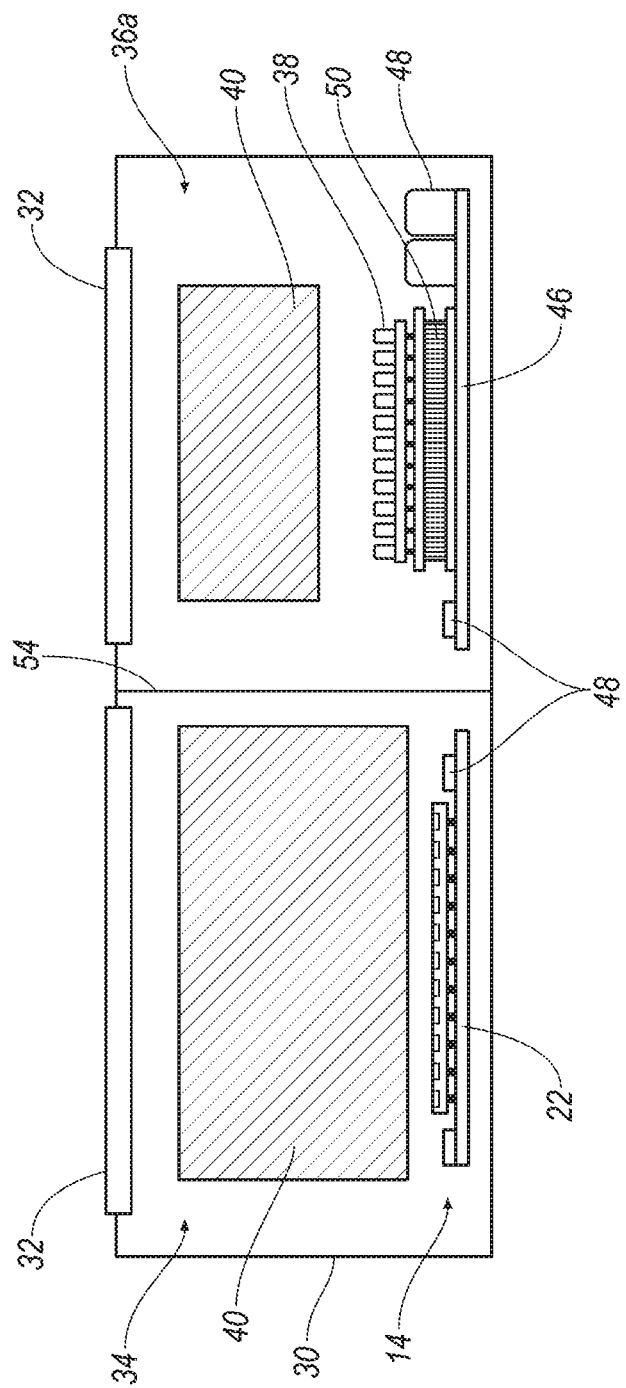
FIG. 3 is an example embodiment of the Lidar system having a vertical-cavity surface-emitting laser (VCSEL).
Figure 4:
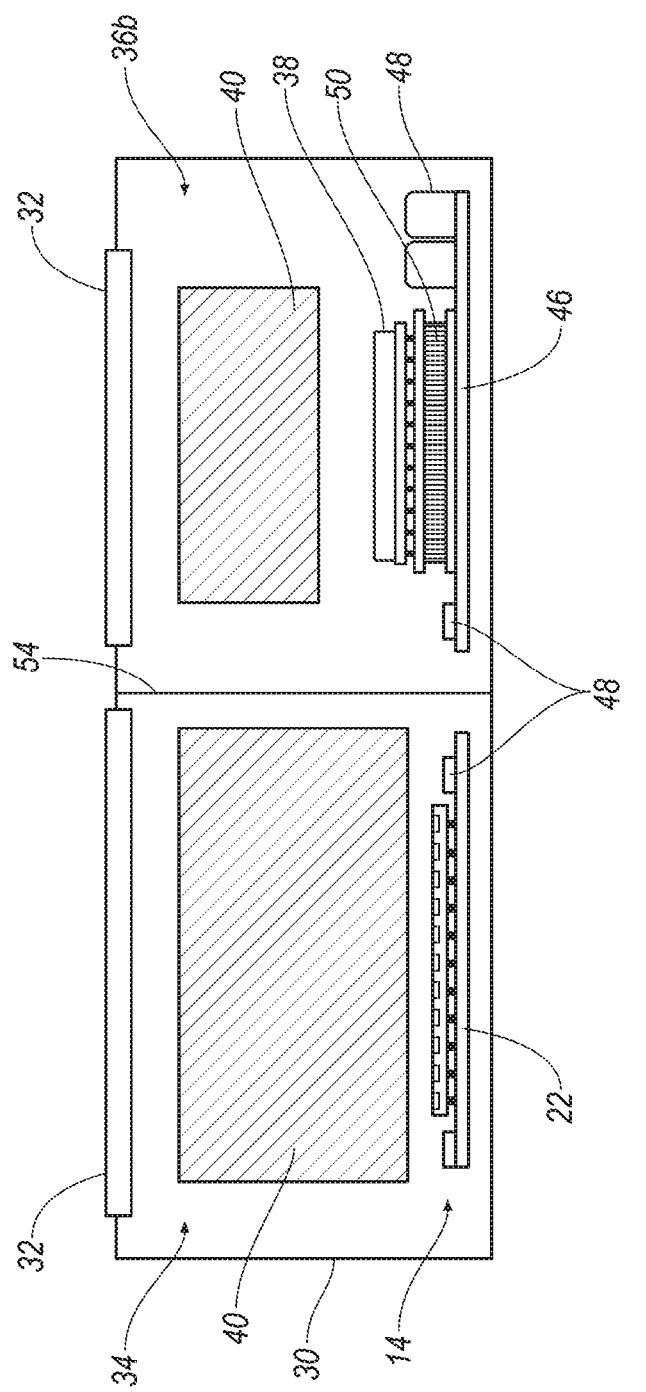
FIG. 4 is an example embodiment of the Lidar system having an edge-emitting laser.
Figure 5:
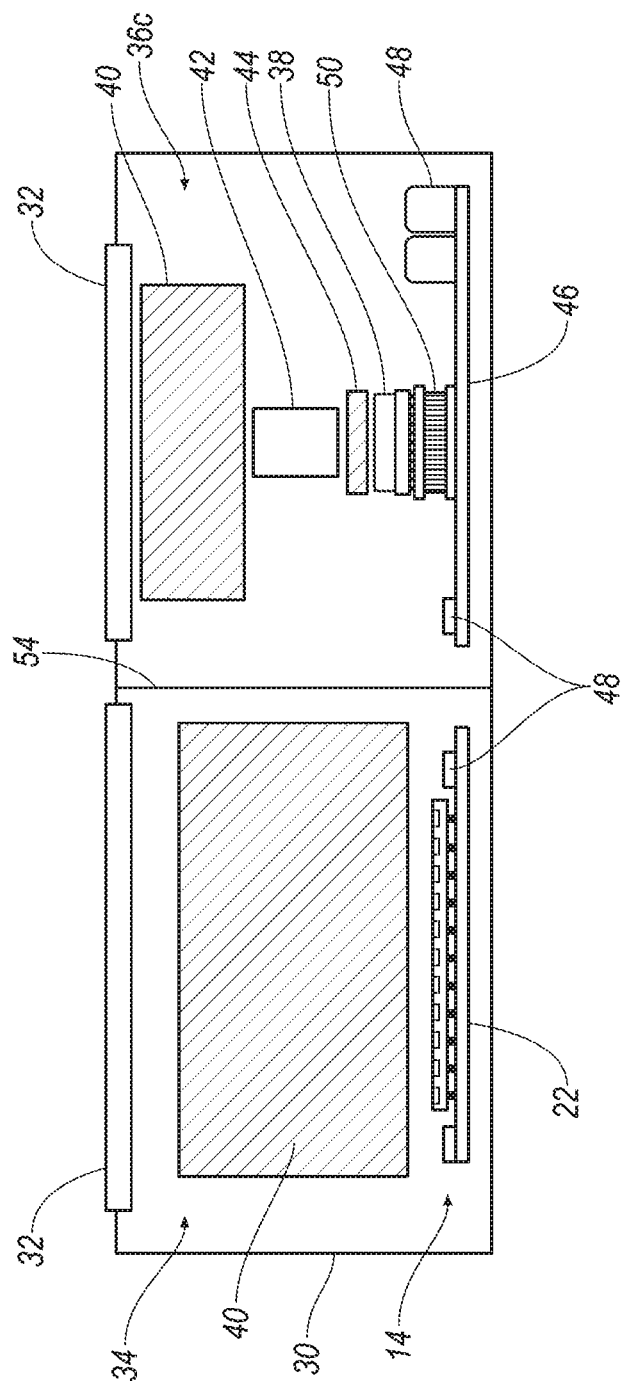
FIG. 5 is an example embodiment of the Lidar system having a diode-pumped solid-state laser (DPSSL).

With reference to FIGS. 3-5, the light emitting system 36 may include one or more light emitter 38 and optical components such as a lens package 40, lens crystal 42, pump delivery optics 44, etc. The optical components, e.g., lens package 40, lens crystal 42, etc., may be between the light emitter 38 on a back end of the casing 30 and the outer optical facia 32 on a front end of the casing 30. Thus, light emitted from the light emitter 36 passes through the optical components before exiting the casing 30 through the outer optical facia 32. Examples of the light emitting system 36 are shown in FIGS. 3, 4, and 5 and are identified with reference numerals 36a, 36b, and 36c, respectively.

The light emitter 38 may be a semiconductor light emitter, e.g., laser diodes. As shown in the example light emitting system 36a of FIG. 3, the light emitter 38 may be a vertical-cavity surface-emitting laser (VCSEL) emitter. As shown in the example in the light emitting system 36b of FIG. 4, the light emitter 38 may be an edge emitting laser emitter 38. As shown in the example in the light emitting system 36c of FIG. 5, the light emitter 38 may be a diode-pumped solid-state laser (DPSSL) emitter. The light emitting system 36 may be designed to emit a pulsed flash of light, e.g., a pulsed laser light. Specifically, the light emitter 38 is designed to emit a pulsed laser light. The light emitted by the light emitting system 36 may be infrared light. Alternatively, the light emitted by the light emitting system 36 may be of any suitable wavelength. The Lidar system 12 may include any suitable number of light emitters 38, i.e., one or more in the casing 30. In examples that include more than one light emitter 38, the light emitters 38 may be identical or different.

The light transmitting system 36 includes a transmitter driver board 46 including electrical components for actuating the light emitter(s) 38. The driver board 46 provides actuation for the light emitter 38 to emit light. The light transmitting system 36 may include passive components 48 such as capacitors, resistors, etc. The light emitting system 36 may include a thermal control system 50. The thermal control system 50 may include one or more cooling devices such as thermal electric coolers (TEC) for cooling the light emitter(s) 38. For example, the Lidar system 12 may include a heat sink on the casing 30 adjacent the light emitter 38. The heat sink may include, for example, a wall adjacent the light emitter 38 and fins extending away from the wall exterior to the casing 30 for dissipating heat away from the light emitter 38. The wall and/or fins, for example, may be material with relatively high heat conductivity. The light emitter 38 may, for example, abut the wall to encourage heat transfer. In addition or in the alternative, the fins, the system may include additional cooling devices, e.g. thermal electric coolers (TEC).

The lens package 40 may include a monolithic optical lens (e.g., glass or plastic) having a light-shaping region. In such examples, the monolithic lens may be of any suitable type that shapes light from the light emitter toward the outer optical facia 32. For example, the lens package 40 may include a diffractive optical element, a diffractive diffuser, a refractive diffuser, a blazed grating, etc.

The pump delivery optics 44 raises (or "pumps") electrons from a lower energy level in an atom or molecule to a higher one, to achieve population inversion. The pump delivery optics 44 is commonly used, in laser construction in order to focus the electrically pumped light 38 into the laser crystal 42.

The light receiving system 34 may include receiving optics such as the lens package 40 and the FPA 14 including multiple photodetectors. The light receiving system 34 may include an outer optical facia 32 and the receiving optics may be between the receiving outer optical facia 32 and the FPA 14.

The FPA 14 detects photons by photo-excitation of electric carriers. An output from the FPA 14 indicates a detection of light and may be proportional to the amount of detected light, in the case of a PiN diode or APD, and may be a digital signal in case of a SPAD. The outputs of FPA 14 are collected to generate a 3D environmental map, e.g., 3D location coordinates of objects and surfaces within FOV of the Lidar system 12, as discussed below with respect to FIGS. 8-9. The FPA 14 may include a semiconductor component for detecting laser and/or infrared reflections from the FOV of the Lidar system 12, e.g., photodiodes (i.e., a semiconductor device having a p-n junction or a p-i-n junction) including avalanche photodiodes, Geiger mode avalanche photodiodes, metal-semiconductor-metal photodetectors, phototransistors, photoconductive detectors, phototubes, photomultipliers, etc. The optical elements such as the lens package 40 of the light receiving system 34 may be positioned between the FPA 14 in the back end of the casing 30 and the outer optical facia 32 on the front end of the casing 30.

The light receiving system 34 includes the ROIC 22 for converting an electrical signal received from photodetectors of the FPA 14 to digital signals. The ROIC 22 may include electrical components which can convert electrical voltage to digital data. The ROIC 22 may be connected to the computer 11, which receives the data from the ROIC 22 and may generate 3D environmental map based on the data received from the ROIC 22.

The light receiving system 34 may include passive electrical components 48 such as capacitors, resistors, etc. As shown in FIGS. 3-5, the light receiving system 34 and the light emitting system 36 may be optically separated from one another by an optical barrier 54. An optical barrier 54 may be formed of plastic, glass, and/or any other suitable material that blocks passage of light. In other words, an optical barrier 54 prevents detection of light emitted from the light emitting system 36, thus limiting the light received by the receiving system 34 to light received from the FOV of the Lidar system 12.

Figure 6A:
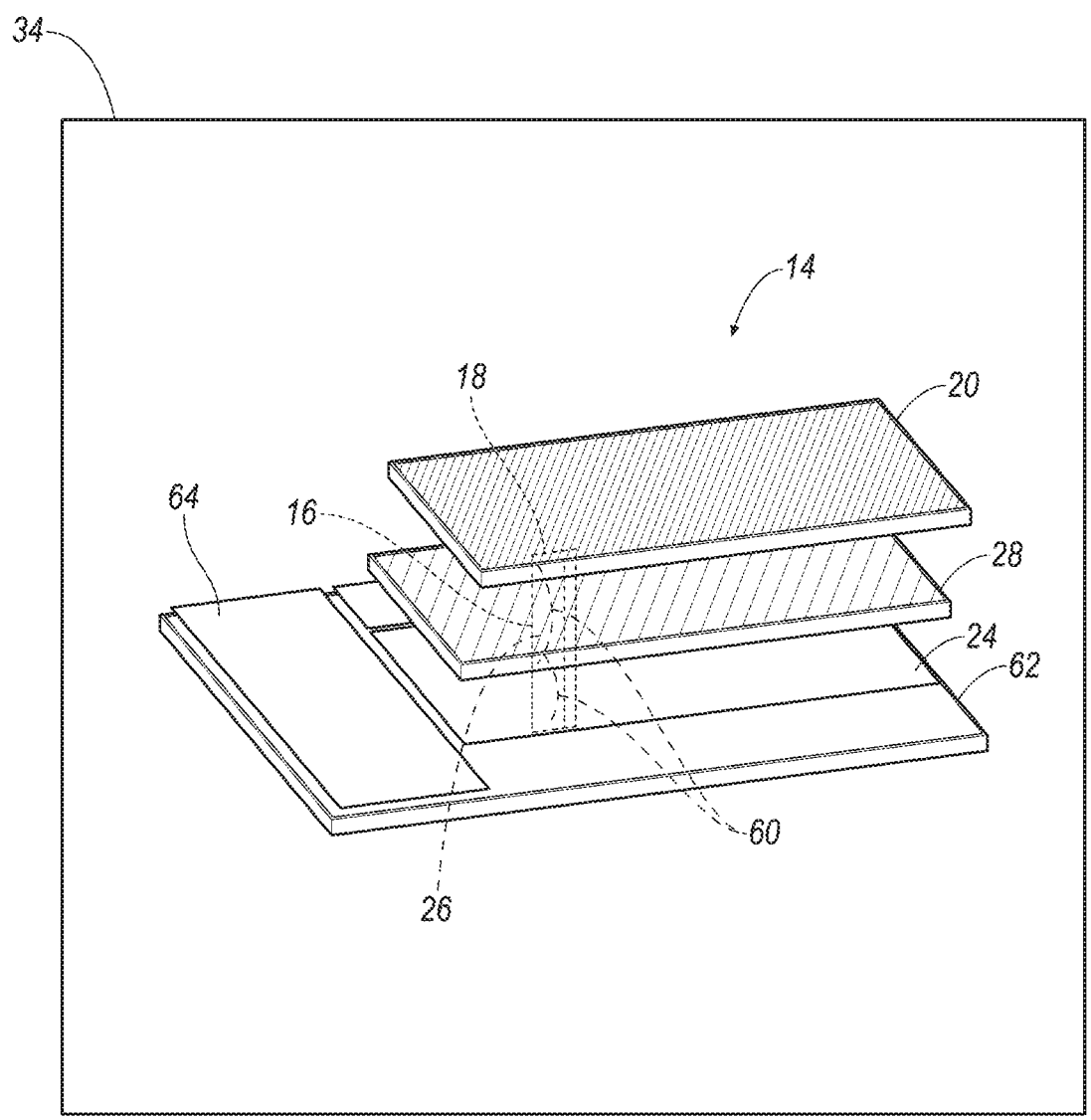
FIG. 6A is a schematic view of a focal-plane array (FPA) of the light receiver with layers illustrated in an exploded position.
Figure 6B:
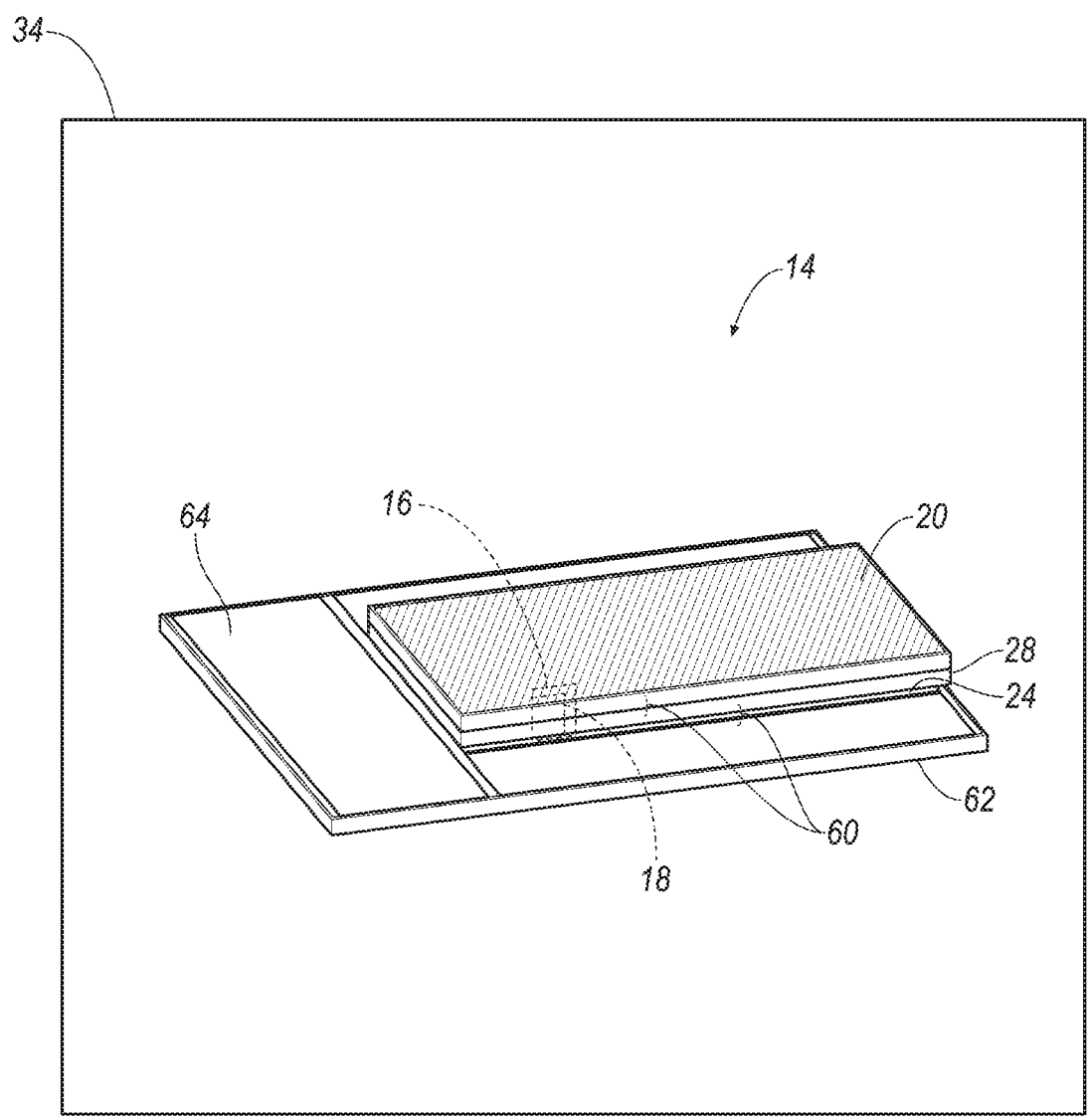
FIG. 6B is another schematic view of the focal-plane array of FIG. 3 with the layers illustrated in a stacked position.

FIGS. 6A-6B illustrate the FPA 14 of the light receiving system 34. FIG. 6A illustrates an exploded position of the FPA 14 and FIG. 6B illustrates a stacked position of the FPA 14. As set forth above, the FPA 14 can include the array of pixels 16. Each pixel 16 includes at least one avalanche-type diode 18 on the first layer 20, the ROIC 22 on the second layer 24, and the power-supply circuit 26 on the middle layer 28 stacked between the first layer 20 and the second layer 24.

The first layer 20 is a focal-plane array layer, the middle layer 28 is a power-control layer, and the second layer is a ROIC and memory layer. Specifically, a plurality of avalanche-type diodes 18 are on the first layer 18, a plurality of ROICs 22 are on the second layer 24, and a plurality of power-supply circuits 26 are on the middle layer 28. Each pixel 16 includes at least one of the avalanche-type diodes 18 connected to only one of the power-supply circuits 26, and each power-supply circuit 26 is connected to only one of the ROICs 22. Said differently, each power-supply circuit 26 is dedicated to one of the pixels 16 and each read-out circuit 22 is dedicated to one of the pixels 16. Each pixel 16 may include more than one avalanche-type diode 18 (for example, two avalanche-type diodes 18 as shown in FIG. 7B, four avalanche-type diodes 18, etc.). The first layer 20 abuts, i.e., directly contacts, the middle layer 28 and the second layer 24 abuts the middle layer 28. Specifically, as detailed further below, the middle layer 28 is directly bonded to the first layer 20 and the second layer 24. The middle layer 28 is between the first layer 20 and the second layer 24. In use, the FPA 14 is in the stacked position, as shown in FIG. 6B. The exploded position, as shown in FIG. 6A, is only for illustration purposes.

The pixel 16 functions to output a single signal or stream of signals corresponding to a count of photons incident on the pixel 16 within one or more sampling periods. Each sampling period may be picoseconds, nanoseconds, microseconds, or milliseconds in duration. The pixel 16 can output a count of incident photons, a time between incident photons, a time of incident photons (e.g., relative to an illumination output time), or other relevant data, and the Lidar system 12 can transform these data into distances from the system to external surfaces in the fields of view of these pixels 16. By merging these distances with the position of pixels 16 at which these data originated and relative positions of these pixels 16 at a time that these data were collected, the computer 11 (or other device accessing these data) can reconstruct a three-dimensional 3D (virtual or mathematical) model of a space within FOV, such as in the form of 3D image represented by a rectangular matrix of range values, wherein each range value in the matrix corresponds to a polar coordinate in 3D space.

The pixels 16 may be arranged as an array, e.g., a 2-dimensional (2D) or a 1-dimensional (1D) arrangement of components. A 2D array of pixels 16 includes a plurality of pixels 16 arranged in columns and rows.

A layer 20, 24, 28, in the present context, is one or more pieces of die. If a layer 20, 24, 28 includes multiple dies, then the dies are placed next to each other forming a plane (i.e., a flat surface). A die, in the present context, is a block of semiconducting material on which a given functional circuit is fabricated. Typically, integrated circuits (ICs) are produced in large batches on a single wafer of electronic-grade silicon (EGS) or other semiconductors (such as GaAs) through processes such as photolithography. A wafer is then cut (diced) into pieces, each containing one copy of the circuit. Each of these pieces is called a die. A wafer (also called a slice or substrate), in the present context, is a thin slice of semiconductor, such as a crystalline silicon (c-Si), used for fabrication of integrated circuits.

The avalanche-type diode 18 may be, for example, an avalanche photodiode (APD) or a single-photon avalanche diode (SPAD). An avalanche-type diode 18 is an analog device that outputs an analog signal. The APD is biased at relatively high bias voltage that approaches the breakdown voltage but is less than the breakdown voltage of the semiconductor. Accordingly, the APD is a linear amplifier for the input signal with limited gain, e.g., a current that is proportional to the light intensity incident on the APD. The SPAD operates at a bias voltage above the breakdown voltage of the semiconductor, i.e., in Geiger mode. Accordingly a single photon can trigger a self-sustaining avalanche with the leading edge of the avalanche indicating the arrival time of the detected photon. In other words, the SPAD is a triggering device.

The power-supply circuits 26 supply power to the avalanche-type diodes 18 of the first layer 20. The power-supply circuit 26 may include active electrical components such as MOSFET (Metal-Oxide-Semiconductor Field-Effect Transistor), BiCMOS (Bipolar CMOS), etc., and passive components such as resistors, capacitors, etc. As an example, the power-supply circuit 26 may supply power to the avalanche diodes 18 in a first voltage range, e.g., 10 to 30 Volt (V) Direct Current (DC), which is higher than a second operating voltage of the ROIC 22 of the second layer 24, e.g., 0.4 to 5V DC. The power-supply circuit 26 may receive timing information from the ROIC 22. Since the power-supply circuit 26 and the ROIC 22 are on separate layers (middle layer 28 and the second layer 24), the low-voltage components for the ROIC 22 and the high-voltage components for the avalanche-type diode 18 are separated, allowing for the top-down footprint of the pixel 16.

As set forth further below, the middle layer 28 is bonded directly to the first layer 20 and the second layer 24. In order to provided electrical connection between the electrical components of the layers 20, 24, 28, e.g., providing power supply from the power-supply circuit 26 on the middle layer 28 to the avalanche-type diodes 18 on the first layer 20 and providing read-out from the avalanche-type diodes 18 on the first layer 20 to the ROICs 22 on the second layer 24, the layers 20, 24, 28 are electrically connected, e.g., via wire bonds or through Silicon Vias (TSV) 60. Specifically, in each pixel 16, the avalanche-type diode 18 is connected by wire bonds or TSVs 60 to the power supply circuit 26 and the ROIC 22 of the pixel 16. Wire bonding is an electrical interconnect technology for making interconnections between two or more semiconductor devices and/or a semiconductor device and a packaging of the semiconductor device. Wire bonds 60 may be formed of aluminum, copper, gold or silver and may typically have a diameter of at least 15 micrometers (μm). Note that wire bonds 60 provide electrical connection between the layers 20, 24, 28 in the stacked position. Therefore, bond wires in FIG. 6A are shown with dashed lines to indicate that the wire bonds 60 may not reach between the layers 20, 24, 28 in the exploded position.

Data output from the ROIC 22 may be stored in a memory chip 62 for processing by the computer 11. The memory chip 62 may be a DRAM (Dynamic Random Access Memory), an SRAM (Static Random Access Memory), and/or a MRAM (Magneto-resistive Random Access Memory) may be electrically connected to the ROIC 22. In one example, an FPA 14 may include the memory chip 62 on the second layer 24 and electrically connected to the ROIC 22. In another example, the memory chip 62 may be attached to a bottom surface of the second layer 24 (i.e., not facing the middle layer 28) and electrically connected, e.g., via wire bods 60, to the ROIC 22 of the second layer 24. Additionally or alternatively, the memory chip 62 can be a separate chip (i.e., not wire bonded to the second layer 24) and the FPA 14 can be stacked on and electrically connected to the memory chip 62, e.g., via TSV.

The FPA 14 may include a circuit 64 that generates a reference clock signal for operating the avalanche-type diodes 18. Additionally, the circuit 64 may include logic circuits for actuating the avalanche diodes 18, power-supply circuit 26, ROIC 22, etc. Operation of the FPA 14 is discussed further below with respect to FIGS. 8-9.

FIGS. 7A-7B are exploded views of two example embodiments of the pixel 16. The pixel 16 may include any number of avalanche-type diodes 18 connected to: (i) the power-supply circuit 26 of the pixel 16 and (ii) to the ROIC 22 of the pixel 16 on the second layer 24. FIG. 7A illustrates an example of the pixel 16 including one avalanche-type diode 18 connected to the power-supply circuit 26 of the pixel 16 and connected to the ROIC 22 of the pixel 16 via the wire bonds 60. As discussed above, the FPA 14 may include a 1D or 2D array of pixels 16. Thus, in the example FPA 14 of FIG. 7A, each avalanche-type diode 18 is individually powered by the power-supply circuit 26 which may prevent cross-talk and/or reduction of bias voltage in some areas, e.g., a central area of the layer 20, of the FPA 14 compared to, e.g., the perimeter of the layer 20. "Individually powered" means a power-supply circuit 26 is electrically connected to each avalanche-type diode 18. Thus, applying power to each of the avalanche-type diodes 18 may be controlled individually.

FIG. 7B illustrates another example pixel 16 which includes two avalanche-type diodes 18, i.e., a first and a second avalanche-type diode 18, connected to the power-supply circuit of the pixel 16 and connected to the ROIC 22 of the pixel 16. As shown in FIG. 7B, a wire bond 60 electrically connects the components of layers 20, 24, 28. Thus, the first and second avalanche diodes 18 of the pixel 16 may be controlled together. In other words, the power-supply circuit 26 may supply power to the first and second avalanche-type diodes 18, e.g., based on a common cathode wiring technique. Although not shown, the pixel 16 may include any number of avalanche-type diodes 18. Additionally or alternatively, the avalanche-type diodes 18 of FIG. 7B may be individually wired (not shown). For example, a first wire bond 60 may electrically connect the power-supply circuit 26 to the first avalanche-type diode 18 and a second wire bond 60 may electrically connect the power-supply circuit 26 to the second avalanche-type diode 18.

With continued reference to FIGS. 7A-7B, to operate the avalanche-type diode 18 to detect light, the pixel 16 typically includes a quenching circuit 66. The quenching circuit 66 of the pixel 16 is typically on the first layer 20. The quenching circuit 66 is discussed below with respect to FIG. 8.

With continued reference to FIGS. 7A-7B, to control the power-supply circuit 26 to apply bias voltage, quench, and reset the avalanche-type diodes 18, the power-supply circuit 26 may include a power-supply control circuit 68. The power-supply control circuit 68 may include electrical components such as a transistor, logical components, etc. The power-supply circuit 26 is further discussed with respect to FIG. 8.

Figure 8:
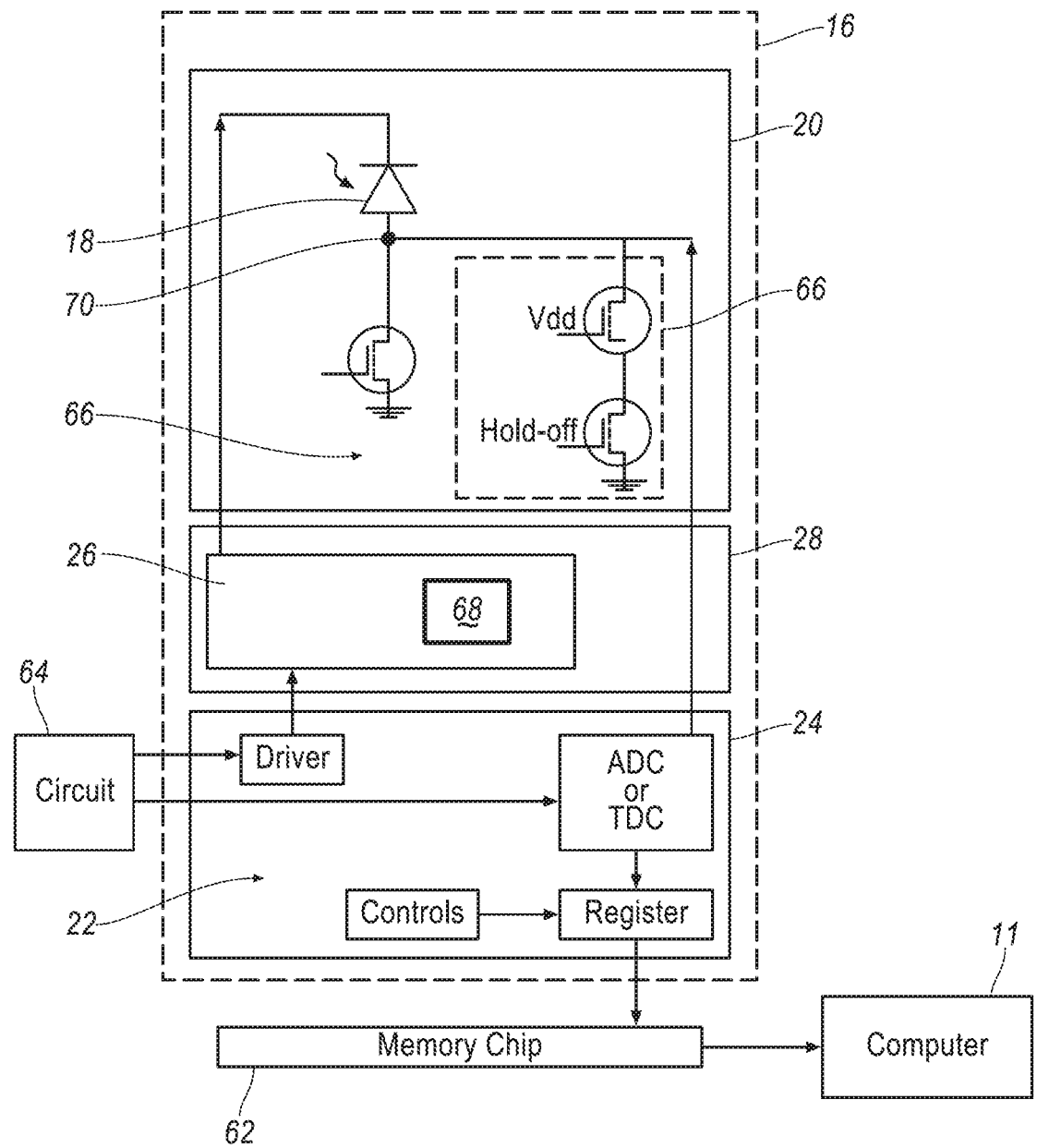
FIG. 8 is a schematic view of an example electrical circuit of the pixel.

FIG. 8 shows an example schematic of electrical components of the pixel 16. FIG. 8 further illustrates the positions of the electrical components on the various layers 20, 24, 28. In this example, a bias voltage, produced by the power-supply circuit 26, is applied to the cathode of the avalanche diode 18. An output of the avalanche-type diode 18, e.g., a voltage at a node 70, is measured by the ROIC circuit 22 to determine whether a photon is detected.

The power-supply circuit 26 supplies the bias voltage to the avalanche-type diode 18 based on inputs received from a driver circuit of the ROIC 22. The ROIC 22 on the second layer 24 may include the driver circuit to actuate the power-supply circuit 26, an analog-to-digital (ADC) or time-to-digital (TDC) circuit to measure an output of the avalanche-type diode 18 at the node 70, and/or other electrical components such as volatile memory (register), and logical control circuits, etc. The driver circuit may be controlled based on an input received from the circuit 64 of the FPA 14, e.g., a reference clock. Data read by the ROIC 22 may be then stored in the memory chip 62. As discussed above, the memory chip 62 may be external to the FPA 14 or included in the FPA 14, e.g., the second layer 24 may be stacked on top of the memory chip 62. A computer, e.g., the computer 11, a computer of the Lidar system 12, etc., may receive the data from the memory chip 62 and generate 3D environmental map, location coordinates of an object within the FOV of the Lidar sensor 12, etc.

As set forth above, in examples in which the avalanche-type diode 18 is a SPAD, the SPAD operates in Geiger mode. "Geiger mode" means that the APD is operated above the breakdown voltage of the semiconductor and a single electron—hole pair (generated by absorption of one photon) can trigger a strong avalanche (commonly known as a SPAD). The SPAD is biased above its zero-frequency breakdown voltage to produce an average internal gain on the order of one million. Under such conditions, a readily-detectable avalanche current can be produced in response to a single input photon, thereby allowing the SPAD to be utilized to detect individual photons. "Avalanche breakdown" is a phenomenon that can occur in both insulating and semiconducting materials. It is a form of electric current multiplication that can allow very large currents within materials which are otherwise good insulators. It is a type of electron avalanche. In the present context, "gain" is a measure of an ability of a two-port circuit, e.g., the SPAD, to increase power or amplitude of a signal from the input to the output port.

When the SPAD is triggered in a Geiger-mode in response to a single input photon, the avalanche current continues as long as the bias voltage remains above the breakdown voltage of the SPAD. Thus, in order to detect the next photon, the avalanche current must be "quenched" and the SPAD must be reset. Quenching the avalanche current and resetting the SPAD involves a two-step process: (i) the bias voltage is reduced below the SPAD breakdown voltage to quench the avalanche current as rapidly as possible, and (ii) the SPAD bias is then raised by the power-supply circuit 26 to a voltage above the SPAD breakdown voltage so that the next photon can be detected.

Quenching is performed using, e.g., a quenching circuit 66 or the like, as shown in FIG. 8 using known techniques. Quenching is performed by sensing a leading edge of the avalanche current, generating a standard output pulse synchronous with the avalanche build-up, quenching the avalanche by lowering the bias down to the breakdown voltage and resetting the SPAD to the operative level.

Quenching may be passive or active quenching. A passive quenching circuit typically includes a single resistor in series with the SPAD. The avalanche current self-quenches because it develops a voltage drop across a resistor, e.g., 100 kΩ (Kilo Ohm) or more. After the quenching of the avalanche current, the SPAD bias voltage recovers and therefore will be ready to detect the next photon. An active circuit element can be used for resetting while performing a passive quench active reset (PQAR).

In an active quenching, upon measuring an onset of the avalanche current across a resistor, e.g., 50Ω, a digital output pulse, synchronous with the photon arrival time is generated. The quenching circuit 66 then quickly reduces the bias voltage to below breakdown voltage, then returns bias voltage to above the breakdown voltage ready to sense the next photon. This mode is called active quench active reset (AQAR), however, depending on circuit requirements, active quenching passive reset (AQPR) may be provided. AQAR circuit typically allows lower dead times (times in which a photon cannot be detected) and reduces dead time compare to circuits 66 having passive quenching and/or passive resetting.

Figure 9:
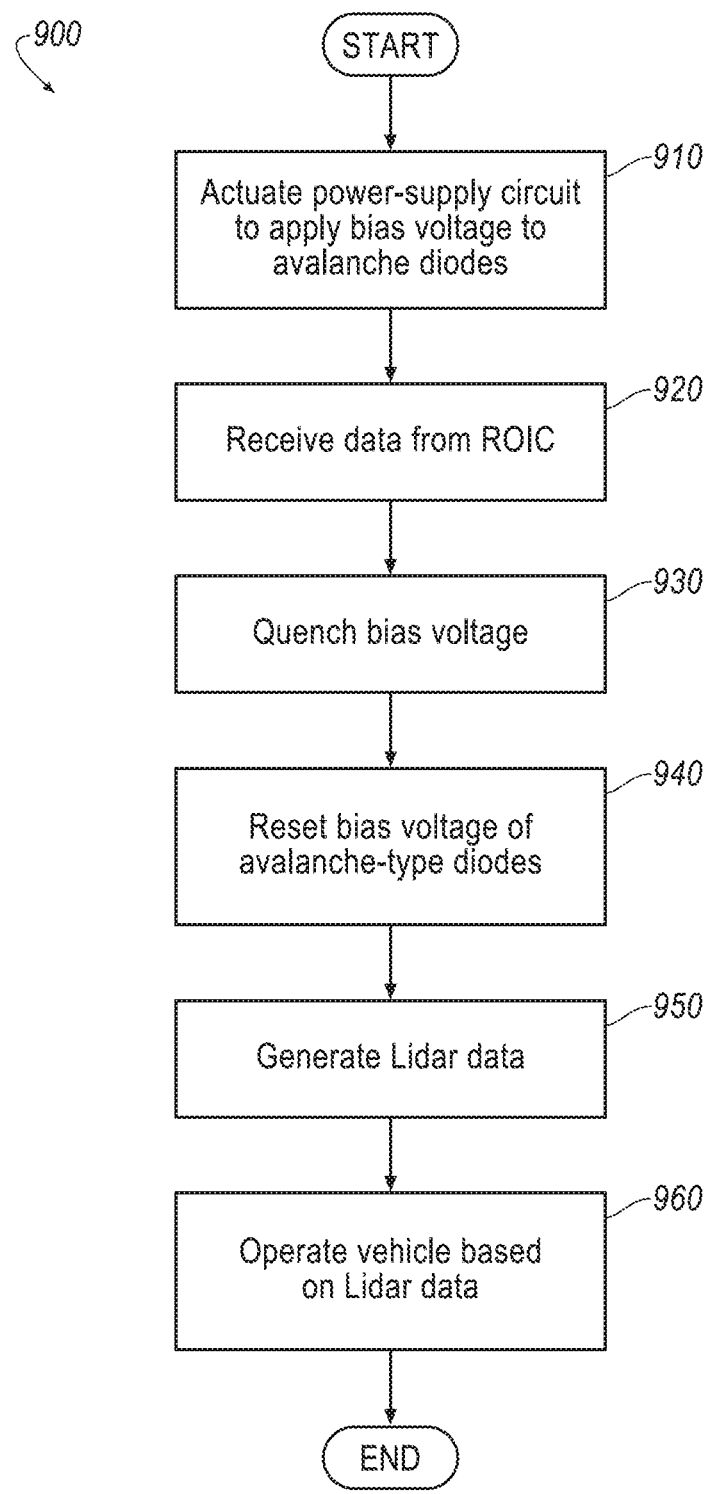
FIG. 9 is a flowchart of an exemplary process for operating the vehicle.

FIG. 9 is a flowchart of an example method 900 for operating the vehicle 10. One or more processors, e.g., the computer 11, may be programmed to execute blocks of the method 900.

The method 900 begins in block 910, in which the computer 11 actuates the power-supply circuit 26 to apply a bias voltage to the plurality of avalanche-type diodes 18. For example, the computer 11 may be programmed to actuate the ROIC 22 to send commands via the ROIC 22 driver to the power-supply control circuit 68 to apply a bias voltage to individually powered avalanche-type diodes 18. Specifically, the computer 11 supplies bias voltage to avalanche-type diodes 18 of the plurality of pixels 16 of the focal-plane array 14 through a plurality of the power-supply circuits 26, each power-supply circuit 26 dedicated to one of the pixels 16, as described above. The individual addressing of power to each pixel 16 can also be used to compensate manufacturing variations via look-up-table programmed at an end-of-line testing station. The look-up-table may also be updated through periodic maintenance of the Lidar system 12.

Next, in block 920, the computer 11 receives data from the Lidar system 12. The computer 11 may be programmed to receive data from the memory chip 62. The data in the memory chip 62 is an output of an ADC and/or TDC of the ROIC 22 including determination of whether any photon was received by any of the avalanche-type diodes 18. Specifically, the computer 11 reads out an electrical output of the at least one of the avalanche-type diodes 18 through read-out circuits 22 of the focal-plane array 14, each read-out circuit 22 of the focal-plane array 14 being dedicated to one of the pixels 16.

Next, in block 930, the computer 11 quenches the bias voltage of the avalanche-type diodes 18. The computer 11 may be programmed to actuate the power-supply control circuit 68 via the ROIC 22 driver to quench the bias voltage of the avalanche-type diodes 18. As discussed above, alternatively, the quenching may be performed passively using known techniques. Thus, quenching may happen automatically through the design of the quenching circuit 66. The computer 11 may flip through each register (e.g., multiple registers per pixel 16, each register representing a certain distance away from the lidar system 12) in order to build up a histogram from all the registers (distances).

Next, in block 940, the computer 11 resets the avalanche-type diodes 18 by actuating the power-supply control circuit 68. As discussed above, alternatively, the resetting can be performed passively using known techniques. Additionally or alternatively, resetting happens through the design of the quenching circuit 66.

Next, in block 950, the computer 11 generates Lidar data. The computer 11 may be programmed to generate a 3D environmental map of the FOV, determine 3D location coordinates of points on surfaces within the FOV, etc., based on the received data. Thus, through multiple laser shots, resets, and readouts a histogram can be generated, based on which the 3D location coordinates can be generated.

Next, in block 960, the computer 11 of the lidar sensors 12 or alternatively a second computer operates the vehicle 10 based at least in part on the generated Lidar data. For example, the computer 11 or the second computer may be programmed to actuate a vehicle 10 braking actuator to stop the vehicle 10 upon detecting, based on the Lidar data, an obstacle within a predetermined distance, e.g., 10 meters, of the vehicle 10. As another example, the computer 11 may be programmed to actuating a vehicle 10 steering actuator to follow a road lane based on road surface data included in the generated Lidar data.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A focal-plane array assembly, comprising:
an array of pixels, each pixel including:
an avalanche-type diode on a first layer;
a read-out circuit on a second layer; and
a power-supply circuit on a middle layer stacked between the first layer and the second layer.

2. The focal-plane array as set forth in claim 1, wherein the array of pixels is a 2-dimensional array.

3. The focal-plane array as set forth in claim 1, wherein the middle layer is bonded directly to the first layer and the second layer.

4. The focal-plane array as set forth in claim 1, wherein the avalanche-type diode is an avalanche photodiode.

5. The focal-plane array as set forth in claim 1, wherein the avalanche-type diode is a single-photon avalanche diode.

6. The focal-plane array as set forth in claim 1, wherein, for each pixel, the pixel includes a second avalanche-type diode connected to the power-supply circuit of the pixel and connected to the read-out circuit of the pixel.

7. The focal-plane array as set forth in claim 1, wherein each pixel includes a quenching circuit connected to the avalanche-type diode.

8. The focal-plane array as set forth in claim 1, further comprising at least one memory chip on the second layer and connected to the read-out circuits, wherein the memory chip is electrically connected to the second layer via wire bonding.

9. A method comprising:
supplying bias voltage to avalanche-type diodes of a plurality of pixels of a focal-plane array through a plurality of power-supply circuits, each power-supply circuit dedicated to one of the pixels;
detecting a photon with at least one of the avalanche-type diodes;
reading out an electrical output of the at least one of the avalanche-type diodes through read-out circuits of the focal-plane array, each read-out circuit of the focal-plane array being dedicated to one of the pixels.

10. The method of claim 9, wherein the avalanche-type diode is a single-photon avalanche diode, and further comprising quenching the single-photon avalanche diode after detecting the photon.

11. The method of claim 9, wherein the focal-plane array further includes:
an array of pixels, each pixel including:
at least one avalanche-type diode on a first layer;
a read-out circuit on a second layer; and
a power-supply circuit on a middle layer stacked between the first layer and the second layer.

12. A Lidar system, comprising:
a light emitter; and
a light receiver having a focal-plane array further including:
an array of pixels, each pixel including:
an avalanche-type diode on a first layer;
a read-out circuit on a second layer; and
a power-supply circuit on a middle layer stacked between the first layer and the second layer.

13. The Lidar system as set forth in claim 12, wherein the light emitter is a Vertical-Cavity Surface-Emitting laser.

14. The Lidar system as set forth in claim 12, wherein the light emitter is a Diode-Pumped Solid-State laser.

15. The Lidar system as set forth in claim 12, wherein the light emitter is an Edge-Emitting Laser.

16. The lidar system as set forth in claim 12, further comprising an optical path having an outer optical facia on a front end and the focal-plane array on a back end, wherein a lens is positioned in the optical path between the front end and the back end.

* * * * *